(12) United States Patent
Yoshida et al.

(10) Patent No.: US 7,399,999 B2
(45) Date of Patent: Jul. 15, 2008

(54) SEMICONDUCTOR DEVICE

(75) Inventors: Tetsuya Yoshida, Gunma (JP); Tetsuya Okada, Kumagaya (JP); Hiroaki Saito, Ota (JP); Shigeyuki Murai, Gunma (JP); Kikuo Okada, Saitama (JP)

(73) Assignees: Sanyo Electric Co., Ltd., Osaka (JP); Gifu Sanyo Electronics Co., Ltd., Gifu (JP)

( * ) Notice: Subject to any disclaimer, the term of this patent is extended or adjusted under 35 U.S.C. 154(b) by 0 days.

(21) Appl. No.: 10/958,640

(22) Filed: Oct. 6, 2004

(65) Prior Publication Data
US 2005/0133814 A1 Jun. 23, 2005

(30) Foreign Application Priority Data
Dec. 19, 2003 (JP) ............... 2003-423339

(51) Int. Cl.
*H01L 29/06* (2006.01)
(52) U.S. Cl. .................. 257/170; 257/E29.007
(58) Field of Classification Search .......... None
See application file for complete search history.

(56) References Cited

U.S. PATENT DOCUMENTS

| | | | | |
|---|---|---|---|---|
| 4,414,560 A | * | 11/1983 | Lidlou | 257/125 |
| 6,495,866 B2 | * | 12/2002 | Kawamoto | 257/175 |
| 6,911,692 B2 | * | 6/2005 | Kobayashi et al. | 257/329 |
| 2002/0050603 A1 | * | 5/2002 | Kawamoto | 257/175 |
| 2002/0167020 A1 | * | 11/2002 | Iwamoto et al. | 257/110 |
| 2003/0052329 A1 | * | 3/2003 | Kobayashi et al. | 257/135 |

FOREIGN PATENT DOCUMENTS

| | | |
|---|---|---|
| JP | 08-306937 | 11/1996 |
| JP | 10-256542 | 9/1998 |
| JP | 2950025 | 7/1999 |
| JP | 2003-008014 | 1/2003 |
| JP | 2004095659 A * | 3/2004 |

* cited by examiner

*Primary Examiner*—Andy Huynh
*Assistant Examiner*—Hoang-Quan Ho
(74) *Attorney, Agent, or Firm*—Morrison & Foerster LLP

(57) ABSTRACT

In a conventional semiconductor device, there was a problem that, in a guard ring region, a shape of a depletion layer is distorted and stable withstand voltage characteristics cannot be obtained. In a semiconductor device of the present invention, a thermal oxide film in an actual operation region and a thermal oxide film in a guard ring region are formed in the same process. Thereafter, the thermal oxide film is once removed and is formed again. Thus, a film thickness of the thermal oxide film on the upper surface of the guard ring region is set to, for example, about 8000 to 10000 Å. Accordingly, a CVD oxide film including moving ions is formed in a position distant from a surface of an epitaxial layer. Consequently, distortion of a depletion layer, which is influenced by the moving ions, is suppressed and desired withstand voltage characteristics can be maintained.

5 Claims, 6 Drawing Sheets

○ : Free carrier (hole)   ⊖ : Free carrier (electron)
+ : Ionized donor         − : Ionized acceptor

US 7,399,999 B2

SEMICONDUCTOR DEVICE

BACKGROUND OF THE INVENTION

1. Field of the Invention

The present invention relates to a thermal oxide film structure on an upper surface of a guard ring formation region in a semiconductor device, more particularly to an element for reducing effects of moving ions.

2. Description of the Related Art

In a conventional semiconductor device, for example, an insulated gate bipolar transistor, a guard ring part (region B) is formed to be continuous with a unit cell part (region A) of an IGBT element in a peripheral region of an element forming region. Accordingly, there has been known an element structure which improves withstand voltage of a guard ring without increasing an ON-resistance of the element (for example, see patent document 1).

Moreover, in a conventional semiconductor integrated circuit, for example, an integrated circuit for high power applications, a P-type guard ring layer is formed in a peripheral part of a vertical IGBT. On the guard ring layer, a horizontal device such as a diode is disposed with an insulating layer interposed therebetween. Accordingly, there has been known an element structure capable of preventing an intensive electric field by equalizing distribution of equal potential lines in both of the vertical IGBT and the horizontal device.

[Patent Document 1]
U.S. Pat. No. 2,950,025 (Page 3 and Page 4, FIG. 1 to FIG. 3)

[Patent Document 2]
Japanese Patent Laid-Open No. Hei 10 (1998)-256542 (Page 3 and Page 4, FIG. 1 to FIG. 3)

SUMMARY OF THE INVENTION

In a conventional semiconductor device, on upper surfaces of a cell region (A region) and a guard ring region (B region), a thermal oxide film and a CVD oxide film are deposited in the same process. Specifically, the oxide film on the upper surface of the guard ring region (B region) is formed based on deposition conditions on the upper surface of the cell region (A region). Accordingly, a high-quality thermal oxide film is thinly formed, and the CVD oxide film and a mold resin, in which moving ions exist, are formed in the vicinity of a surface of a N layer. Thus, there was a problem that, in the guard ring region (B region), the moving ions distort a shape of a depletion layer and reliability is deteriorated.

Moreover, as shown in patent document 1 described above, in the conventional semiconductor device, on an upper surface of a P layer positioned nearest to the cell region (A region) in the guard ring region (B region), a source electrode is electrically connected. However, in the conventional semiconductor device, since the source electrode is disposed on an upper surface in a P layer formation region, there was a problem that ability of collecting breakdown currents is weak.

In the present invention, the thermal oxide film on the upper surface of the guard ring region is formed to be thicker than that of the cell region and the CVD oxide film is disposed to be distant from a surface of a semiconductor layer. Accordingly, in the present invention, deterioration of the reliability due to the moving ions within the CVD oxide film and the mold resin on an upper surface of the guard ring region is prevented.

The present invention was made in consideration for the foregoing problem. A semiconductor device of the present invention includes: a semiconductor layer including an actual operation region, in which a plurality of cells are formed, and a guard ring region disposed around the actual operation region; a diffusion region which forms a boundary between the actual operation region and the guard ring region from a surface of the semiconductor layer; a thermal oxide film formed on the surface of the semiconductor layer; and a CVD oxide film formed on the thermal oxide film. In the semiconductor device, the thermal oxide film includes first and second thermal oxide films having different film thicknesses, the second thermal oxide film is thicker than the first thermal oxide film and the second thermal oxide film is formed on an upper surface of the guard ring region. Therefore, in the semiconductor device of the present invention, the thermal oxide film on the upper surface of the guard ring region is formed to be thicker than the thermal oxide film on an upper surface of the actual operation region. Thus, the CVD oxide film in which moving ions exist can be disposed to be distant from the surface of the semiconductor layer.

Moreover, in the semiconductor device of the present invention, the first thermal oxide film is an oxide film which is removed after being formed in the same process as that of the second thermal oxide film and is formed again to have a desired thickness. Therefore, in the semiconductor device of the present invention, after the first and second thermal oxide films are formed in the same process, a film thickness of the first thermal oxide film formed on the upper surface of the actual operation region can be set to a desired film thickness.

Moreover, in the semiconductor device of the present invention, one end of a metal wiring layer is positioned at the guard ring region side beyond one end of the diffusion region. Therefore, in the semiconductor device of the present invention, in a depletion layer formed by the diffusion region and the semiconductor layer, an electric field is stabilized by the metal wiring layer and a shape of the depletion layer is stabilized. Thus, withstand voltage characteristics can be improved.

Moreover, in the semiconductor device of the present invention, the metal wiring layer positioned on the upper surface of the guard ring region is formed so as to surround the actual operation region. Therefore, in the semiconductor device of the present invention, the guard ring region is disposed so as to surround the actual operation region. Furthermore, the metal wiring layer is disposed so as to surround the actual operation region. Thus, the electric field is stabilized by the metal wiring layer and the shape of the depletion layer is stabilized. Consequently, the withstand voltage characteristics can be stabilized.

As described above, first, in the semiconductor device of the present invention, a thermal oxide film and a CVD oxide film are deposited on an upper surface of an epitaxial layer forming the semiconductor layer. The thermal oxide film on the upper surface of the guard ring region is formed to have a film thickness of, for example, about 8000 to 10000 Å. According to this structure, in the present invention, the CVD oxide film including moving ions can be disposed in a position distant from a surface of the epitaxial layer in the guard ring region maintaining the withstand voltage characteristics. Consequently, distortion of the depletion layer, which is influenced by the moving ions, can be suppressed and desired withstand voltage characteristics can be maintained.

Secondly, in the semiconductor device of the present invention, a tip of a depletion layer is formed of a PN junction region between the diffusion region formed on a boundary between the actual operation region and the guard ring region, and the epitaxial layer. Thereafter, the tip portion of the depletion layer is converged to a tip portion of a gate electrode.

Accordingly, in the present invention, the tip portion of the gate electrode is formed so as to be positioned at the guard ring region side beyond the diffusion region. According to this structure, in the present invention, in a region where the depletion layer is converged, a change in curvature of the depletion layer is relieved and distortion of the depletion layer can be suppressed. Thus, the desired withstand voltage characteristics can be maintained.

Thirdly, in the semiconductor device of the present invention, at least cells disposed in arrays at both ends among the plurality of cells formed in the actual operation region are arranged as free cells in which source regions and the like are not formed. In the guard ring region, when a certain voltage value or more is applied thereto, a breakdown current is generated. In the present invention, the breakdown current is drawn out from the gate electrode formed on the boundary between the actual operation region and the guard ring region. In this event, a part of the breakdown current flows into the cell arrays at the both ends. However, since the cell arrays at the both ends are free cell arrays, local destruction can be prevented.

DESCRIPTION OF THE EMBODIMENTS

With reference to FIG. 1 to FIG. 6, a semiconductor device according to an embodiment of the present invention will be described in detail below.

Figure 1A:
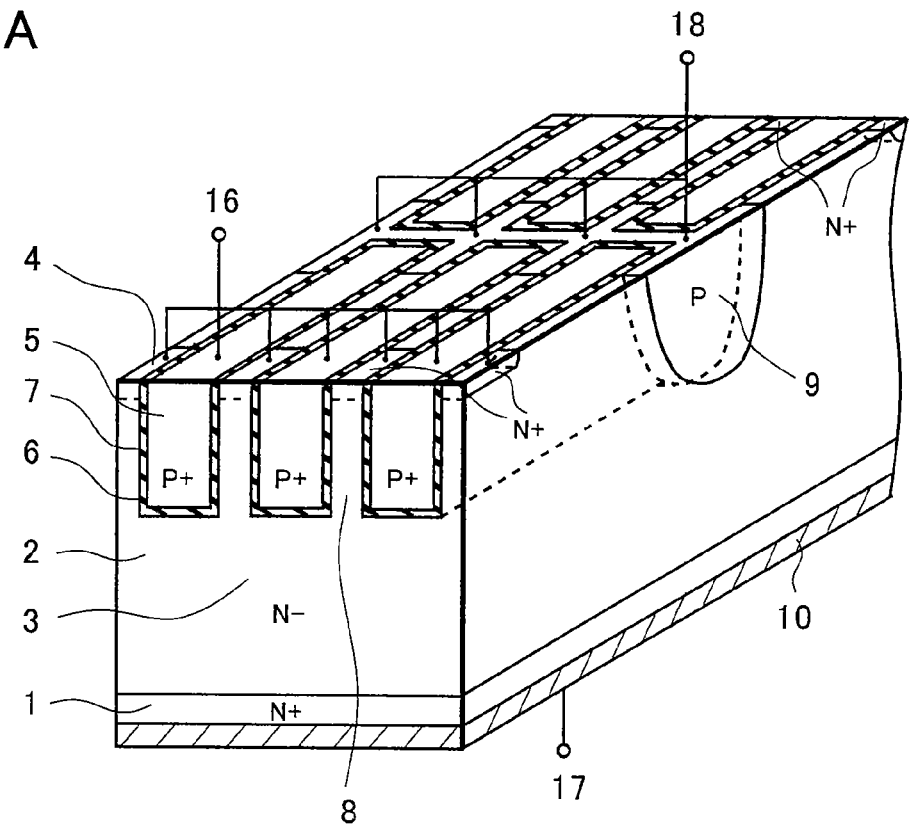
FIG. 1A is a perspective view and FIG. 1B is a top view for explaining a semiconductor device according to an embodiment of the present invention.
Figure 1B:
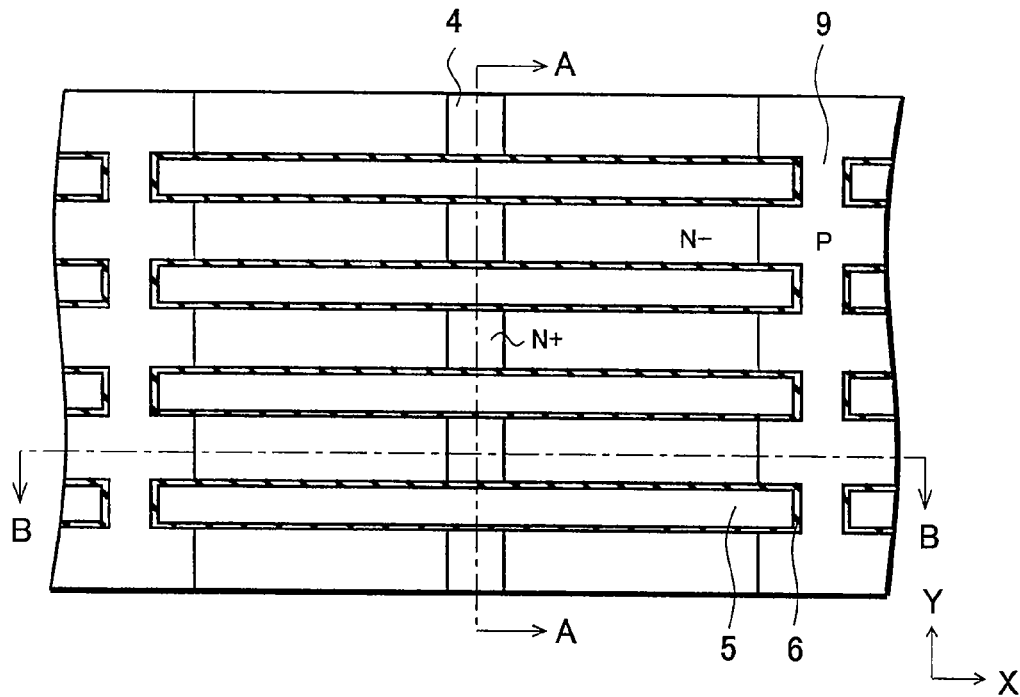

FIG. 1A is a perspective view showing a structure of the semiconductor device according to the embodiment of the present invention. FIG. 1B is a top view showing the structure of the semiconductor device according to the embodiment of the present invention. As shown in FIG. 1A, on a N-type semiconductor substrate 1, a N-type epitaxial layer 2 is deposited. A plurality of trenches 7 are formed from a surface of the epitaxial layer 2. The trenches 7 are arranged so as to be parallel to each other at even intervals. The substrate 1 is used as a drain lead-out region and the epitaxial layer 2 is mainly used as a drain region 3. Moreover, sidewalls of the trenches 7 are etched to be approximately perpendicular to the surface of the epitaxial layer 2. In addition, insulating films 6 are formed on inner walls of the trenches 7. Furthermore, in the trenches 7, polysilicon, for example, into which P-type impurities are injected, is deposited. Accordingly, although described in detail later, the polysilicon in the trenches 7 is electrically connected to a source region 4 through aluminum (Al), for example, on the surface of the epitaxial layer 2. Thus, the P-type polysilicon in the trenches 7 is used as a fixed-potential insulated electrode 5 having the same potential as that of a source electrode 16. Meanwhile, the epitaxial layer 2 positioned between the plurality of trenches 7 is used as a channel region 8.

As shown in FIG. 1A and FIG. 1B, in this embodiment, a gate region 9 is separated from the source region 4 and a plurality of the gate regions 9 are provided in the epitaxial layer 2 at fixed intervals. As shown in FIG. 1B, between two of the gate regions 9 extending in a Y axis direction, the source region 4 is formed. One source region 4 is formed so as to be equidistant from the respective gate regions 9. The source region 4 is positioned approximately parallel to the gate regions 9 in the Y axis direction. Meanwhile, the trenches 7, which form the fixed-potential insulated electrodes 5, are formed in a direction orthogonal to the source region 4 and the gate regions 9, that is, in a X axis direction. Accordingly, both ends of the trench 7 overlap the respective gate regions 9 at a part of a formation region thereof. Moreover, the trenches 7 are formed at fixed intervals in the Y axis direction.

Figure 2A:
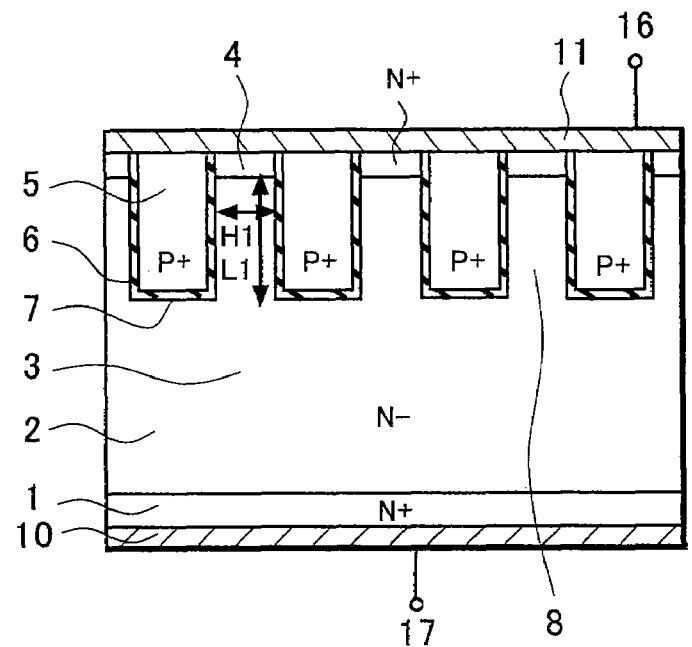
FIG. 2A and FIG. 2B are cross-sectional views for explaining the semiconductor device according to an embodiment of the present invention.
Figure 2B:
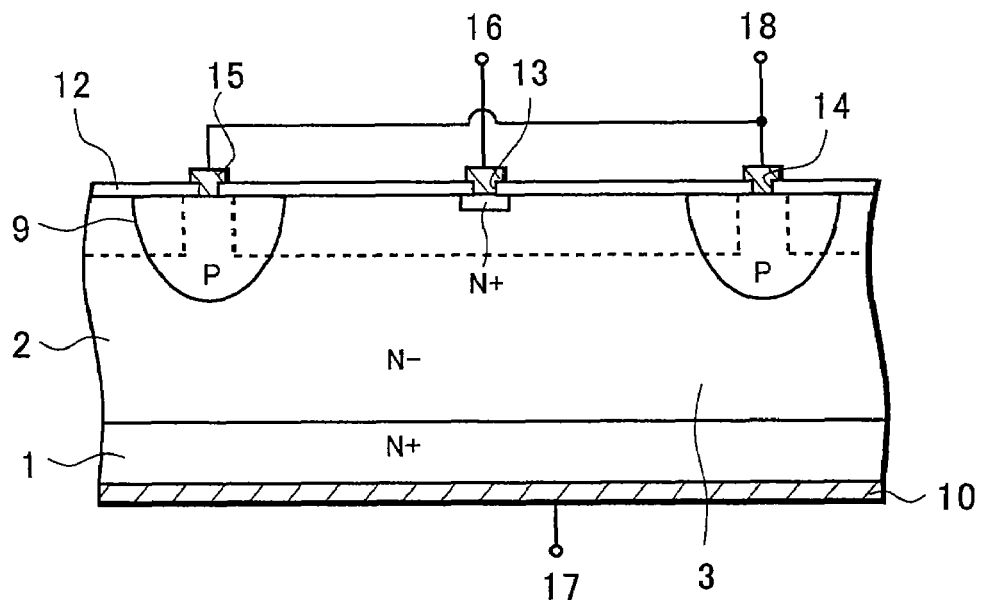

Next, with reference to FIG. 2A and FIG. 2B, description will be given of a cross-sectional structure and operations of the semiconductor device according to the embodiment of the present invention. FIG. 2A is a cross-sectional view along the line A-A in FIG. 1B. FIG. 2B is a cross-sectional view along the line B-B in FIG. 1B.

As shown in FIG. 2A, the channel region 8 is mainly a region which is positioned below the source region 4 and surrounded by the trenches 7. In the channel region 8, an arrow H1 is a channel thickness and an arrow L1 is a channel length. Specifically, the channel thickness H1 means an interval between the insulating films 6 facing each other in the channel region 8 and the channel length L1 means a distance from a bottom surface of the source region 4 to a bottom surface of the fixed-potential insulated electrode 5 along the sidewall of the trench 7. Moreover, an Al layer 10, for example, comes into ohmic contact with a back of the N-type substrate 1 used as the drain lead-out region. A drain electrode 17 is formed through this Al layer 10.

Meanwhile, on the surface of the epitaxial layer 2, a silicon oxide film 12 as an insulating layer is formed (see FIG. 2B). Accordingly, through a contact region 13 (see FIG. 2B) which is provided in the silicon oxide film 12, an Al layer 11 comes into ohmic contact with the source region 4. Moreover, the Al layer 11 also comes into ohmic contact with the fixed-potential insulated electrode 5 through the contact region 13. According to this structure, as described above, the fixed-potential insulated electrode 5 is grounded and the source region 4 and the fixed-potential insulated electrode 5 are maintained to have the same potential. Moreover, the channel region 8 positioned below the source region 4 is also substantially maintained to have the same potential as that of the fixed-potential insulated electrode 5. Note that, in the semiconductor device of this embodiment, conduction and cutoff of a main current is controlled by a depletion layer formed in the channel region 8. Thus, as long as the conditions are fulfilled, a shape of the fixed-potential insulated electrode 5 included in a unit cell, a shape of the source region 4 and the like are arbitrary.

As shown in FIG. 2B, the silicon oxide film 12 is deposited on the surface of the epitaxial layer 2 including surfaces of the gate regions 9. On the gate region 9, a gate electrode 18 made of Al, for example, is formed through a contact region 14 provided in the silicon oxide film 12. Note that a broken line in FIG. 2B indicates the presence of the fixed-potential insulated electrode 5. Here, in the cross-sectional view and the top view, corner portions of the insulating film 6 are drawn to have a square shape. However, those drawings are schematic and, in reality, the corner portions may be round. Specifically, it is widely and generally adopted that the corner portions are formed to be round in order to suppress electric field concentration.

Next, description will be given of operation principles of the semiconductor device according to the embodiment of the present invention.

First, an OFF operation of the semiconductor device will be described. As described above, a current path of the semiconductor device includes: the N-type substrate 1 that is the drain lead-out region; the drain region 3 formed of the N-type epitaxial layer 2; the N-type channel region 8 positioned between the trenches 7; and the N-type source region 4. Specifically, all the regions are formed of N-type regions. Thus, it appears that the OFF operation is impossible when the device is operated in a state where a positive voltage is applied to the drain electrode 17 and the source electrode 16 is grounded.

However, as described above, the N-type region including the source region 4 and the channel region 8, and the P-type region that is the fixed-potential insulated electrode 5 are connected to each other through the Al layer 11 and have the same potential. Thus, in the channel region 8 around the fixed-potential insulated electrode 5, due to a work function difference between the P-type polysilicon and the N-type epitaxial layer 2, a depletion layer extends so as to surround the fixed-potential insulated electrode 5. Specifically, by adjusting a width between the trenches 7 which form the fixed-potential insulated electrodes 5, that is, the channel thickness H1, the channel region 8 is filled with the depletion layer extending from the fixed-potential insulated electrodes 5 at both sides. Although described in detail later, the channel region 8 filled with the depletion layer described above becomes a pseudo P-type region.

According to the structure described above, the N-type drain region 3 and the N-type source region 4 can be subjected to PN junction separation by the channel region 8 that is the pseudo P-type region. Specifically, the semiconductor device according to the embodiment of the present invention is set in a cutoff state (OFF state) from the start by forming the pseudo P-type region in the channel region 8. Moreover, when the semiconductor device is OFF, a positive voltage is applied to the drain electrode 17, the source electrode 16 is grounded and the gate electrode 18 is grounded or a negative potential is applied to the gate electrode 18. In this event, a reverse bias is applied to an interface between the channel region 8 that is the pseudo P-type region and the drain region 3 that is the N-type region. Thus, a depletion layer is formed downward on the page space. Accordingly, a formation state of this depletion layer influences withstand voltage characteristics of the semiconductor device.

Figure 3A:
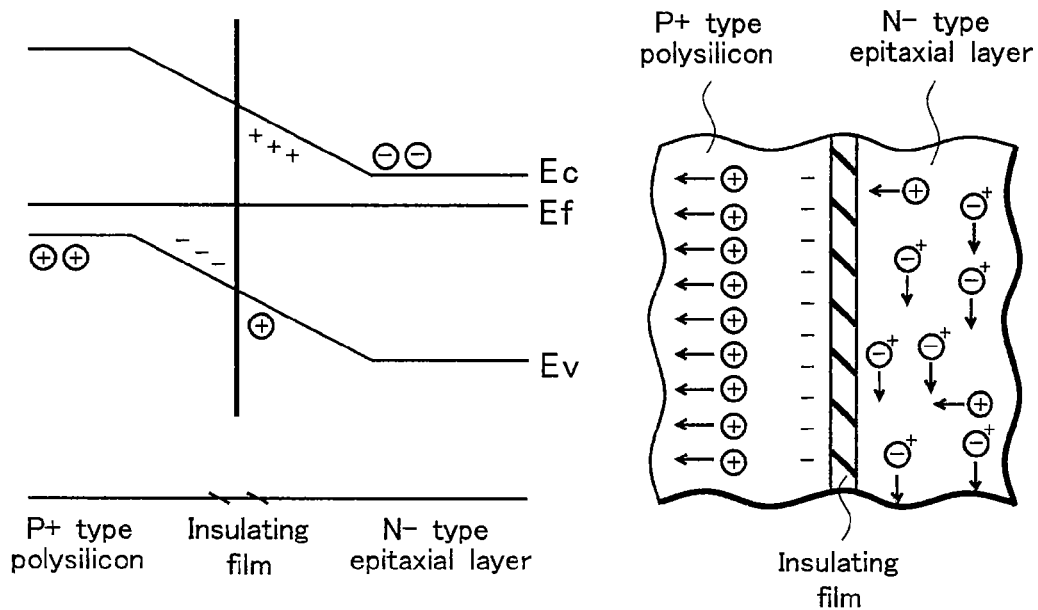
FIG. 3A is an energy band diagram and FIG. 3B is a view of a channel region at time of OFF for explaining the semiconductor device according to an embodiment of the present invention.
Figure 3B:
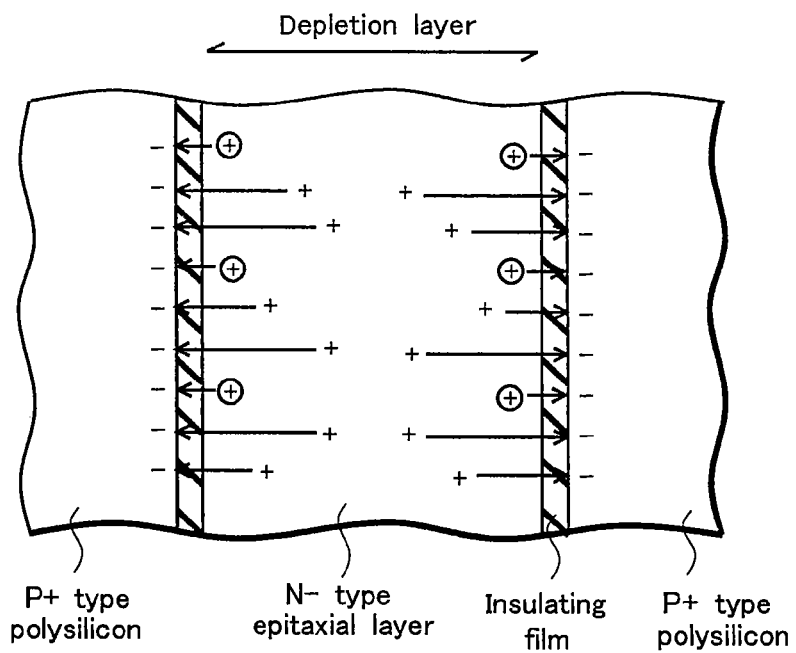

Here, with reference to FIG. 3A and FIG. 3B, the above-described pseudo P-type region will be described below. FIG. 3A shows an energy band diagram in the channel region 8 at the time of OFF. FIG. 3B schematically shows the depletion layer formed in the channel region 8 at the time of OFF. The P-type polysilicon region, that is the fixed-potential insulated electrode 5, and the N-type epitaxial layer 2 region, that is the channel region 8, face each other across the insulating film 6. The both regions are maintained to have the same potential through the Al layer 11 on the surface of the epitaxial layer 2. Accordingly, a depletion layer is formed around the trenches 7 due to the work function difference between the both regions. Consequently, a small number of free carriers (holes) existing in the depletion layer create a P-type region.

To be more specific, when the P-type polysilicon region and the N-type epitaxial layer 2 region are set to have the same potential through the Al layer 11, the energy band diagram is formed as shown in FIG. 3A. First, in the P-type polysilicon region, a valence band is formed with a negative slope on an interface of the insulating film 6. This state shows that the interface of the insulating film 6 has a high potential energy with respect to the free carriers (holes). Specifically, the free carriers (holes) in the P-type polysilicon region cannot exist on the interface of the insulating film 6 and are pushed to the direction of separating from the insulating film 6. As a result, on the interface of the insulating film 6 in the P-type polysilicon region, negative charges including ionized acceptors are left behind. Accordingly, in the N-type epitaxial layer 2 region, positive charges including ionized donors are required, which are paired up with the negative charges including the ionized acceptors described above. Thus, the channel region 8 is depleted from the interface of the insulating film 6.

However, impurity concentration of the channel region 8 is about 1E14 (/cm$^3$) and a thickness thereof is about 0.8 to 1.4 μm. Thus, the channel region 8 is completely occupied by the depletion layer extending from the fixed-potential insulated electrode 5. In a practical sense, even if the channel region 8 is depleted, it is impossible to secure enough positive charges to match the ionized acceptors. Thus, a small number of free carriers (holes) also exist in the channel region 8. Accordingly, as shown in FIG. 3B, the ionized acceptors in the P-type polysilicon region and the free carriers (holes) or the ionized donors in the N-type epitaxial layer 2 are paired up to form an electric field. As a result, the depletion layer formed from the interface of the insulating film 6 becomes a P-type region and the channel region 8 filled with this depletion layer becomes a P-type region.

Next, description will be given of a state where the operation of the semiconductor device is shifted from OFF to ON. First, a positive voltage is applied to the gate electrode 18 from the grounded state. In this event, although free carriers (holes) are introduced from the gate region 9, as described above, the free carriers (holes) are attracted to the ionized acceptors and flow into the interface of the insulating film 6. Accordingly, the interface of the insulating film 6 in the channel region 8 is filled with the free carriers (holes). Thus, the ionized acceptors in the P-type polysilicon region and the free carriers (holes) only are paired up to form an electric field. Consequently, free carriers (electrons) come to exist from a farthest area from the insulating film 6 in the channel region 8, that is, a central area of the channel region 8 and a neutral region appears. As a result, the depletion layer in the channel region 8 is reduced, a channel is opened from the central area, the free carriers (electrons) move to the drain region 3 from the source region 4 and a main current flows.

Specifically, the free carriers (holes) spread instantly by using the wall surface of the trench 7 as a passage, the depletion layer extending from the fixed-potential insulated electrode 5 to the channel region 8 is retreated and the channel is opened. Furthermore, if a voltage of a predetermined value or more is applied to the gate electrode 18, a PN junction formed by the gate region 9, the channel region 8 and the drain region 3 becomes a forward bias. Thereafter, the free carriers (holes) are directly injected into the channel region 8 and the drain region 3. As a result, a number of the free carriers (holes) distributed in the channel region 8 and the drain region 3 cause conductivity modulation and the main current starts to flow with a low ON-resistance.

Lastly, description will be given of a state where the operation of the semiconductor device is shifted from ON to OFF. In order to turn off the semiconductor device, the potential of the gate electrode 18 is set in a grounded state (0V) or is set to a negative potential. Accordingly, a large amount of the free carriers (holes) existing in the drain region 3 and the channel region 8 disappears or is removed to the outside of the device through the gate region 9. Thus, the channel region 8 is filled with the depletion layer again and becomes the pseudo P-type region again. Consequently, the withstand voltage is maintained and the main current stops.

Figure 4A:
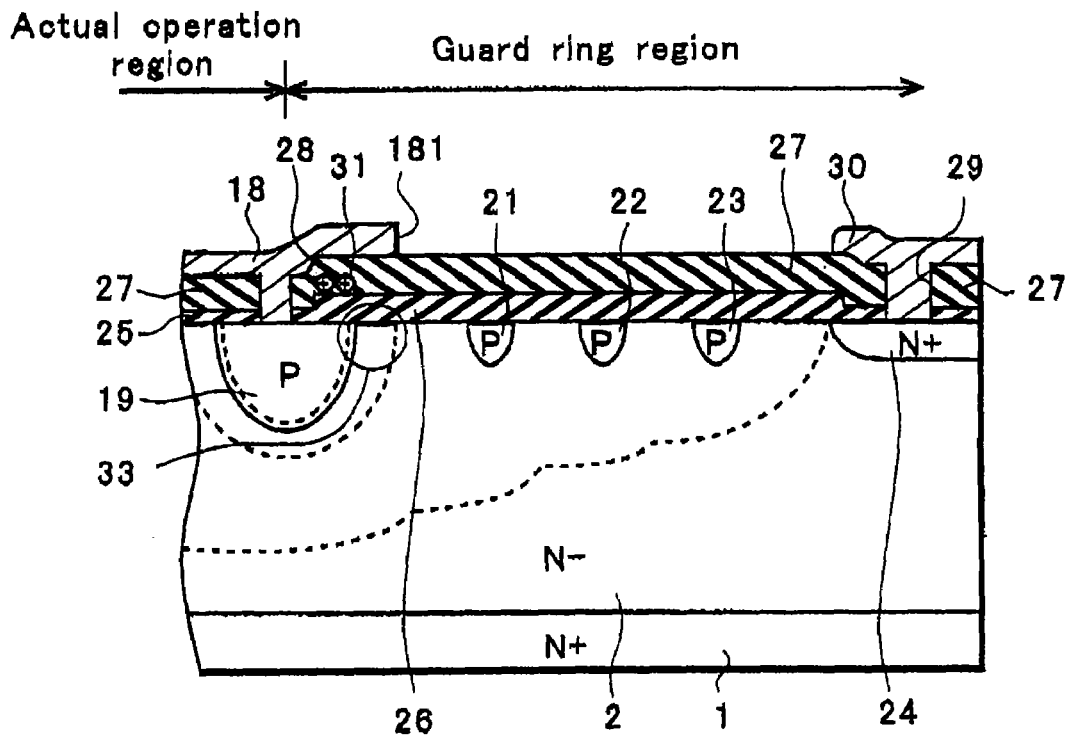
FIG. 4A is a cross-sectional view for explaining a guard ring region of the semiconductor device according to an embodiment of the present invention.
Figure 4B:
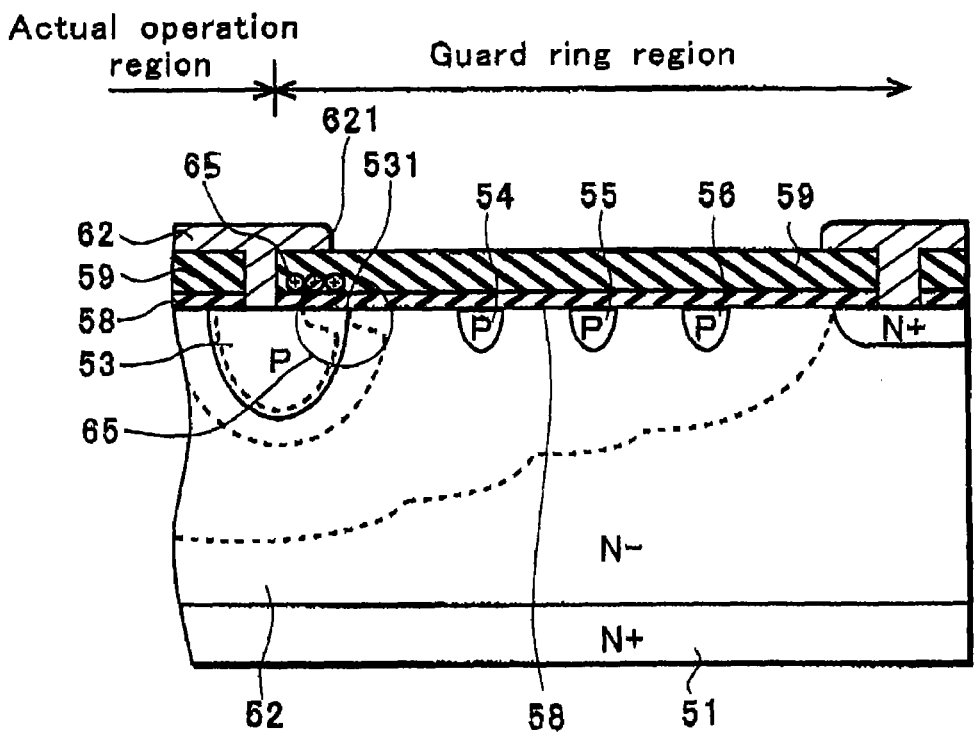
FIG. 4B is a cross-sectional view for explaining a guard ring region of a conventional semiconductor device.
Figure 5:
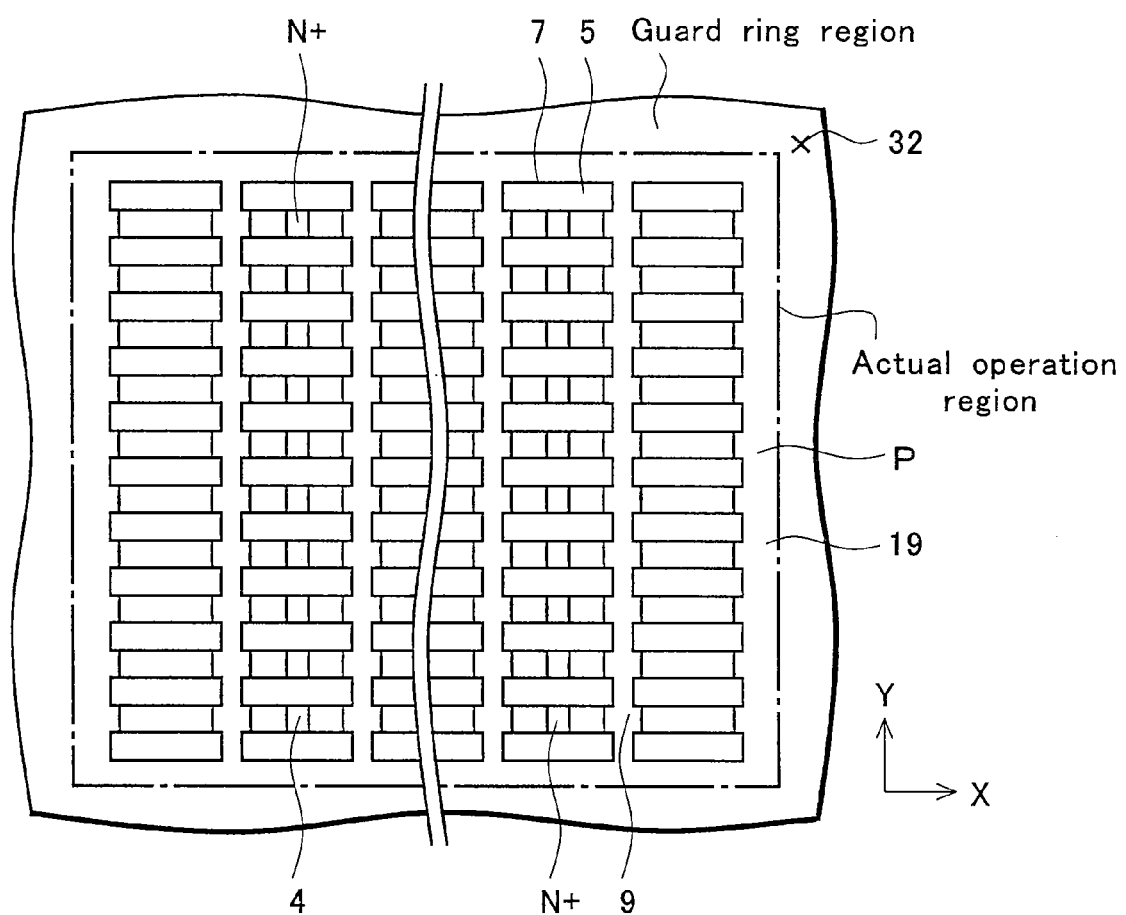
FIG. 5 is a top view for explaining the semiconductor device according to an embodiment of the present invention.

Next, FIG. 4A is a cross-sectional view of a guard ring region in the embodiment of the present invention. FIG. 4B is a cross-sectional view of a guard ring region in a conventional semiconductor device. FIG. 5 is a top view schematically showing an actual operation region of the embodiment of the present invention.

As shown in FIG. 4A, the guard ring region is disposed so as to surround the actual operation region described above. Accordingly, the withstand voltage characteristics of the semiconductor device are improved. In this embodiment, a P-type diffusion region 19 formed to be continuous with the gate region 9 is disposed at the boundary between the actual operation region and the guard ring region. In the N-type epitaxial layer 2 in the guard ring region, first to third guard rings 21, 22 and 23, which are formed of P-type diffusion regions, are arranged so as to surround the actual operation region. In the guard ring region, an annular ring 24 formed of a N-type diffusion region is formed in a peripheral portion of the outermost third guard ring 23. By forming the annular ring 24, extension of the depletion layer can be suppressed and a leak current into the substrate 1 through a side face of a chip can be prevented.

Note that, in the guard ring region, the number of the guard rings and the spacing between the guard rings are designed according to the withstand voltage characteristics of the semiconductor device. Moreover, the withstand voltage can be improved by increasing the number of the guard rings. However, the actual operation region with respect to a chip area is reduced. Thus, the number of the guard rings is designed while also taking operation efficiency into consideration with respect to the chip area.

On an upper surface of the expitaxial layer 2, thermal oxide films 25 and 26 are formed by using a thermal oxidation method and a CVD oxide film 27 is formed by using a CVD method. In these oxide films 25, 26, and 27, contact regions 28 and 29 are formed. The gate electrode 18 comes into ohmic contact with the P-type diffusion region 19 through the contact region 28. Meanwhile, a shield electrode 30 comes into ohmic contact with the N-type diffusion region 24 through the contact region 29.

In this embodiment, the thermal oxide film 25 formed on the epitaxial layer 2 in the actual operation region and the thermal oxide film 26 formed on the epitaxial layer 2 in the guard ring region are formed by using the thermal oxidation method including the same steps. Thereafter, the thermal oxide film 25 on an upper surface of the actual operation region is removed in a photolithography step performed for the region when forming a cell and is formed again after the photolithography step. As a result, specifically, a film thickness of the thermal oxide film 25 on the upper surface of the actual operation region is set to, for example, about 400 to 600 Å. Meanwhile, a film thickness of the thermal oxide film 26 on an upper surface of the guard ring region is set to, for example, about 8000 to 10000 Å. Subsequently, on the thermal oxide films 25 and 26, the CVD oxide film 27 is deposited by using the CVD method including the same steps.

Note that, as shown in FIG. 4A, in this embodiment, the thermal oxide film 26 is formed on the upper surface of the guard ring region between a part of the P-type diffusion region 19 and the diffusion region of the annular ring 24. However, it is not required to limit the formation region of the thermal oxide film 26 to the region described above. As long as a region which prevents deterioration of the withstand voltage is at least satisfied, optional design changes are possible.

Meanwhile, as shown in FIG. 4B, in the conventional guard ring region, a P-type diffusion region 53 and first to third guard rings 54, 55, and 56 are arranged in an epitaxial layer 52 deposited on a surface of a substrate 51, as in the case of the structure of this embodiment. In the conventional structure, on the epitaxial layer 52 in the actual operation region and the guard ring region, a thermal oxide film 58 is formed to have a thickness of, for example, about 500 Å by using the thermal oxidation method including the same steps. On the thermal oxide film 58, a CVD oxide film 59 is deposited.

As described above, in this embodiment, the film thickness of the thermal oxide film 26 formed on the upper surface of the guard ring region is set to, for example, about 8000 to 10000 Å. On the thermal oxide film 26, the CVD oxide film 27 is disposed, which is formed in a deposition step performed at a lower temperature than that of the thermal oxide film 26. In the CVD oxide film 27 or in a mold resin covering the semiconductor device, moving ions 31 exist. The moving ions 31 are influenced by an electric field generated by heat or the operation of the device and move within the CVD oxide film 27 or within the mold resin.

Particularly, in the guard ring region, a reverse bias is applied to the PN junction region, a depletion layer is generated and the withstand voltage characteristics of the device are maintained. However, if the thermal oxide film 58 is formed to be thin as in the case of the conventional structure shown in FIG. 4B, the CVD oxide film 59 is disposed near the surface of the epitaxial layer 52. Accordingly, under the influence of an electric field, moving ions 64 move to a boundary between the thermal oxide film 58 and the CVD oxide film 59. Thus, free carriers (electrons) are attracted to the surface of the epitaxial layer 52 by the moving ions 64. As a result, in a region indicated by the circle 65, the free carriers (electrons) exist in the vicinity of the PN junction region and the shape of the depletion layer formed in the guard ring region is distorted. Thus, the withstand voltage characteristics of the device are deteriorated.

Accordingly, in this embodiment, a high-quality thermal oxide film 26, which is formed by performing a high-temperature heat treatment step in the guard ring region and includes no moving ions, is formed to be as thick as, for example, about 8000 to 10000 Å. Accordingly, although, as in the case of the conventional structure, the moving ions 31 are included in the CVD oxide film 27 or in the mold resin, the moving ions exist in a region distant from the surface of the epitaxial layer 2. As a result, in a region indicated by the circle 33, the shape of the depletion layer formed in the guard ring region is not distorted and desired withstand voltage characteristics can be maintained.

Furthermore, in this embodiment, in the guard ring region influenced by the moving ions 31, the thermal oxide film 26 is formed to have a desired thickness and, on the thermal oxide film 26, the CVD oxide film 27 is deposited in the same process as the actual operation region. Specifically, in this embodiment, the influence of the moving ions can be relieved also by use of the CVD oxide film.

Note that, in this embodiment, the film thickness of the thermal oxide film 26 on the upper surface of the guard ring region is set to, for example, about 8000 to 10000 Å. However, it is not required to limit the thickness thereof within this range. For example, the thickness of the thermal oxide film 26 may be one capable of suppressing deterioration of the withstand voltage characteristics due to the moving ions 31 included in the CVD oxide film 27 or in the mold resin.

Next, as shown in FIG. 5, in this embodiment, the actual operation region is surrounded by the guard ring region. The P-type diffusion region 19 exists on the boundary between the actual operation region and the guard ring region. The gate region 9 is formed to be continuous with the P-type diffusion region 19, extends in the illustrated Y axis direction and is provided in a ladder shape. The trenches 7 extending in the illustrated X axis direction are divided by the gate region 9 extending in the Y axis direction. Thus, a plurality of cells is formed in the actual operation region.

Moreover, as shown in FIG. 4A, in this embodiment, one end 181 of the gate electrode 18 connected to the P-type diffusion region 19 in ohmic contact therewith is disposed at the guard ring region side beyond the periphery of the P-type diffusion region 19.

To be more specific, as shown in FIG. 5, the P-type diffusion region 19 is disposed so as to surround the actual operation region. The one end 181 of the gate electrode 18 is disposed at the guard ring region side beyond the periphery of the P-type diffusion region 19 indicated by the dashed line. Moreover, the gate electrode 18 is also disposed so as to surround the actual operation region as in the case of the P-type diffusion region 19. Meanwhile, in the conventional structure shown in FIG. 4B, one end 621 of a gate electrode 62 is disposed nearer to the actual operation region than to the periphery of the P-type diffusion region 53. Thus, particularly, a tip of a depletion layer formed of a PN junction region between the P-type diffusion region 53 and the epitaxial layer 52 is converged to one end 531 of the P-type diffusion region 53. Thus, a curvature radius of the depletion layer is reduced. As a result, a shape of the depletion layer formed of the PN junction region described above is distorted and the withstand voltage characteristics of the device are deteriorated.

Accordingly, in this embodiment, the one end 181 of the gate electrode 18 is disposed at the guard ring region side beyond the periphery of the P-type diffusion region 19. A tip of a depletion layer formed of a PN junction region between the P-type diffusion region 19 and the epitaxial layer 2 is converged to a tip portion at the one end 181 of the gate electrode 18. Here, in this embodiment, since the one end 181 of the gate electrode 18 is disposed at the guard ring region side beyond the periphery of the P-type diffusion region 19, reduction of the curvature radius in the convergence portion of the depletion layer can be relieved. As a result, distortion of the shape of the depletion layer formed of the PN junction region described above can be reduced and the withstand voltage characteristics of the device can be maintained.

Furthermore, in this embodiment, for example, no source region 4 is provided for arrays of the trenches 7 positioned at both sides in the illustrated X axis direction and the arrays thereof are not used as cells for an actual operation. In the guard ring region, when a voltage of a certain value or more is applied to the PN junction region, breakdown occurs. Particularly, in a corner portion of the P-type diffusion region 19, which is indicated by a X mark 32, the curvature of the depletion layer is small, electric field concentration is likely to occur and a breakdown current is likely to be generated. Here, in this embodiment, the breakdown current can be drawn out by the gate electrode 18 disposed so as to surround the actual operation region. Accordingly, as described above, a cell array in the vicinity of the corner portion of the P-type diffusion region 19, which is indicated by the X mark 32, is not used for the actual operation. Specifically, the cells positioned in the arrays at the both sides in the illustrated X axis direction are formed as free cell arrays. Thus, there is a case where the breakdown current flows into the cell near the X mark 32 since all the breakdown currents cannot be instantly drawn out from the gate electrode. In this case, regions into which the breakdown currents flow are set to be the free cell arrays. Thus, destruction of the cells for the actual operation can be suppressed. As a result, in this embodiment, while maintaining a constant withstand voltage, destruction of the device due to the breakdown current at the time of occurrence thereof can be suppressed.

Figure 6:
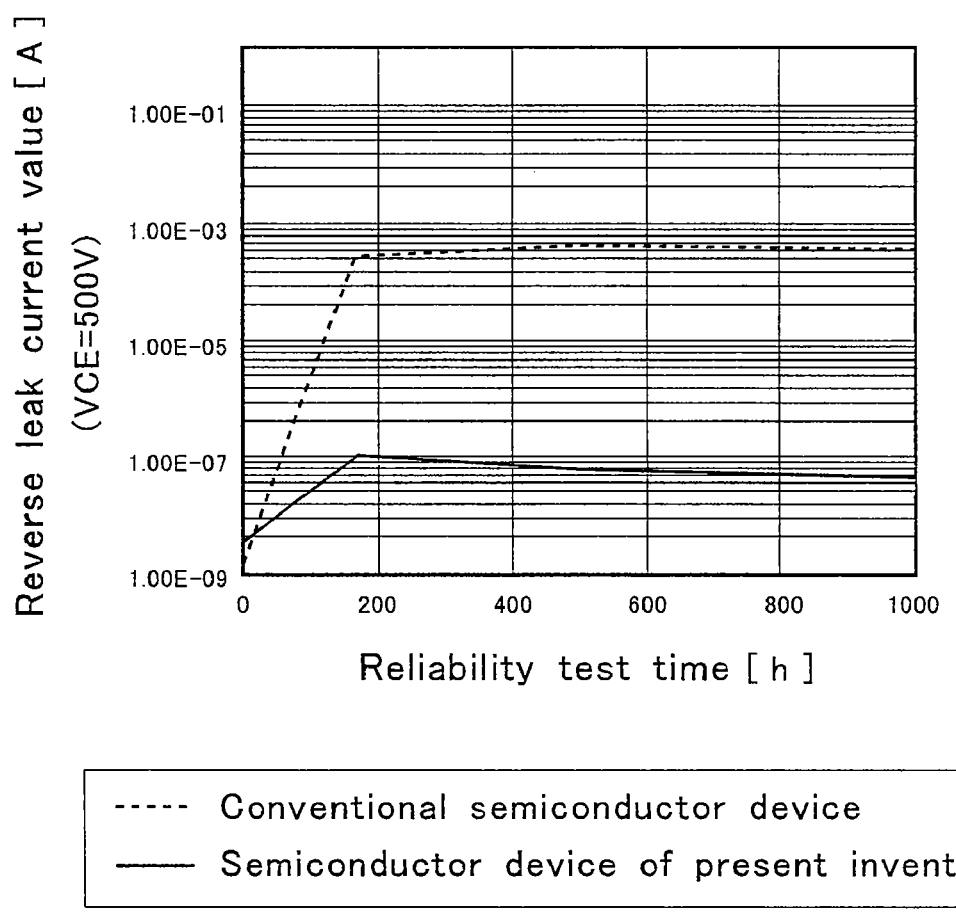
FIG. 6 is a graph showing test data in a reliability test of the semiconductor device according to an embodiment of the present invention and the conventional semiconductor device.

Next, FIG. 6 is a result of a reliability test for the device and shows respective test results of the conventional semiconductor device and the semiconductor device according to the embodiment of the present invention under the same conditions. Note that test conditions in this embodiment are as follows. Specifically, the semiconductor device is put in a furnace heated to 150° C. and, in the furnace, a reverse bias of 600V is continuously applied between a drain and a source in a state where a gate and the source are short-circuited. Thereafter, the semiconductor device is taken out from the furnace and a reverse bias of 500V is applied between the drain and the source at room temperature. In this event, a reverse leak current between the drain and the source in the state where the gate and the source are short-circuited (hereinafter referred to as a reverse leak current) is measured.

As shown in FIG. 6, the horizontal axis indicates time of putting the device in the furnace and the vertical axis indicates reverse leak current values. In both of the conventional semiconductor device and the semiconductor device of this embodiment, the reverse leak current values are increased after the tests are started and, thereafter, the values are maintained approximately constant. In the embodiment of the present invention, by forming the structure of the guard ring formation region described above, an increase of the reverse leak current value (deterioration of the withstand voltage) in a harsh environment can be drastically decreased.

As described above, in this embodiment, the description was given of the case where, after the thermal oxide films are formed in the same process, the thermal oxide film on the upper surface of the actual operation region is removed. However, it is not required to limit the embodiment of the present invention to the case described above. For example, also in the case where the thermal oxide film on the upper surface of the actual operation region and the thermal oxide film on the upper surface of the guard ring region are formed in separate processes, similar effects can be obtained. Besides the above, various changes are possible without departing from the scope of the embodiment of the invention.

What is claimed is:

1. A semiconductor device comprising:
   a semiconductor layer comprising an actual operation region in which a plurality of cells are formed and a guard ring region disposed around the actual operation region, the cells comprising corresponding source, gate and drain regions;
   a diffusion region which forms a boundary between the actual operation region and the guard ring region and is formed in a surface of the semiconductor layer;
   a thermally-grown oxide film formed on the surface of the semiconductor layer;
   a CVD oxide film formed on the thermally-grown oxide film;
   a metal wiring layer electrically connected to the diffusion region and formed on the CVD oxide film, the metal wiring layer being connected to the diffusion region through a contact region provided in the first thermally-grown oxide film and the CVD oxide film; and a gate electrode disposed on the gate regions and electrically connected to the metal wiring layer, wherein the thermally-grown oxide film comprises first and second thermally-grown oxide films juxtaposed on the semiconductor layer, the second thermally-grown oxide film is thicker than the first thermally-grown oxide film and is formed on the guard ring region, and the first thermally-grown oxide film is formed on at least part of the actual operation region, and one end of the metal wiring layer extends toward the side of the guard ring region beyond one end of the diffusion region, said one end being the farther end of said metal wiring layer from the actual operation region.

2. The semiconductor device according to claim 1, wherein an annular ring is formed in the outermost periphery of the guard ring region and the second thermally-grown oxide film is formed at least on the surface of the semiconductor layer between the diffusion region and the annular ring.

3. The semiconductor device according to claim 1, wherein the metal wiring layer is disposed so as to surround the actual operation region.

4. The semiconductor device according to claim 1, wherein the gate regions are embedded in the semiconductor layer.

5. The semiconductor device according to claim 1, wherein the metal wiring layer is an extension of the gate electrode.

* * * * *